(12) United States Patent
Cho et al.

(10) Patent No.: US 6,897,115 B2
(45) Date of Patent: May 24, 2005

(54) METHOD OF FABRICATING NON-VOLATILE MEMORY DEVICE

(75) Inventors: In-Soo Cho, Kyunggi-do (KR); Jae-Min Yu, Seoul (KR); Byung-Goo Jeon, Yongin-shi (KR); Jun-Yeoul You, Suwon (KR); Chang-Yup Lee, Kyunggi-do (KR)

(73) Assignee: Samsung Electronics, Co., Ltd., Kyungki-do (KR)

( * ) Notice: Subject to any disclaimer, the term of this patent is extended or adjusted under 35 U.S.C. 154(b) by 44 days.

(21) Appl. No.: 10/643,538

(22) Filed: Aug. 19, 2003

(65) Prior Publication Data

US 2004/0156247 A1 Aug. 12, 2004

(30) Foreign Application Priority Data

Sep. 12, 2002 (KR) .................................. 10-2002-0055292

(51) Int. Cl.[7] .............................................. H01L 21/336
(52) U.S. Cl. ...................... 438/259; 438/257; 438/265; 438/266
(58) Field of Search ................................ 438/257–259, 438/265–266, 593–596

(56) References Cited

U.S. PATENT DOCUMENTS 6,593,187 B1 * 7/2003 Hsieh ........................ 438/257

2002/0072170 A1 * 6/2002 Lam ........................... 438/239

FOREIGN PATENT DOCUMENTS

JP          03185737          8/1991

OTHER PUBLICATIONS

English Abstract***.

* cited by examiner

*Primary Examiner*—Dung A. Le
(74) *Attorney, Agent, or Firm*—F. Chau & Associates, LLC

(57) ABSTRACT

A method of fabricating a non-volatile memory device includes the steps of forming a lower conductive layer on a substrate, forming a lower and an upper sacrificial patterns on the substrate with the lower conductive layer, wherein the lower and upper sacrificial patterns include a trench exposing the lower conductive layer, forming mask spacers on sidewalls of the upper and lower sacrificial patterns, using the mask spacers and the upper sacrificial pattern as an etch mask, etching the exposed lower conductive layer to form a lower conductive pattern exposing the substrate, forming a plug conductive layer covering an entire surface of a substrate with the lower conductive pattern, and planarizingly etching the plug conductive layer until the lower sacrificial pattern is exposed, thereby forming a source plug in a gap region between the mask spacers that is connected to the substrate.

20 Claims, 7 Drawing Sheets

METHOD OF FABRICATING NON-VOLATILE MEMORY DEVICE

BACKGROUND

1. Technical Field

The present invention relates to a method of fabricating semiconductor devices. More specifically, the present invention is directed to a method of fabricating non-volatile memory devices of a split gate type.

2. Discussion of Related Art

As electrical devices become pocket-sized and portable, non-volatile memory devices are needed to preserve stored information when the device loses power. FLASH memory devices are non-volatile and data can further be electrically programmed and erased. The FLASH memory devices are classified as stack-gate type and slit-gate type memory devices.

A stack-gate type FLASH memory device comprises a floating gate and a control gate, which are sequentially stacked. In addition, the stack-gate type FLASH memory uses a channel hot electron injection and Fowler-Nordheim tunneling to program and erase memory. An advantage of the stack-gate type FLASH memory is that it can be highly integrated. However, a disadvantage of a stack-gate type FLASH memory is that it over-erases and it turns on unselected cell transistors. A split-gate type FLASH memory device includes a control gate disposed over a channel to control the on and off state of the channel to prevent the over-erasing problem.

FIGS. 1–4 are cross-sectional views for illustrating a conventional method of fabricating a split gate type memory device.

Referring to FIG. 1, a device isolation layer (not shown) is formed to define an active region in a predetermined region of a substrate 10. A lower conductive layer parallel to the active region is formed on a substrate with the device isolation layer. Therefore, a top surface of the device isolation layer is exposed between two adjoining lower conductive layers.

A sacrificial pattern 88, which is preferably a silicon nitride, is formed on the lower conductive layer. The sacrificial pattern 88 includes a trench that crosses over the active region and exposes a top portion of the lower conductive layer. Mask spacers 30 are formed on inner sidewalls of the trench. Then, the lower conductive layer is etched using the mask spacers 30 as an etch mask. Thus, a lower conductive pattern 20 is formed under the mask spacers 30 and the sacrificial pattern 88, and a portion of the substrate between the spacers 30 is exposed. In this case, the mask spacers 30 have curved sidewalls like a conventional spacer. Therefore, the mask spacers 30 become narrower from a bottom portion to a top portion of the spacers.

An impurity region serving as a source "s" is formed in the exposed portion of the substrate 10. Then, insulation spacers are formed on sidewalls of the lower conductive pattern 20. Next, a plug conductive layer 40, which is connected to the source "s," is formed by filling a gap region formed between the mask spacers 30 and the insulation spacers.

Referring to FIGS. 2 and 3, the plug conductive layer 40 is planarized by etching until a top portion of the sacrificial pattern 88 is exposed, thereby forming a source plug 45 that fills the gap region. A silicon oxide layer is formed on the source plug 45, and the exposed sacrificial pattern 88 is removed. Thus, the lower conductive pattern 20 is exposed beside the mask spacers 30. Next, the exposed lower conductive pattern 20 is etched to form floating gates 25 under the mask spacers 30. Then, oxide layers are formed on the sidewalls of the floating gate 25. Next, an upper conductive layer 50 is conformally formed to a thickness$_0$ to cover the entire resultant structure.

The upper conductive layer 50 is planarized by etching to expose the mask spacers 30, thereby forming an upper conductive pattern beside the mask spacers 30. The upper conductive pattern is patterned to form control gates 55 on the sidewalls of the mask spacers 30. Next, impurity regions are formed in a substrate beside the control gates 55. The impurity regions serve as a drain "d."

The control gates 55 comprise a word line of cell transistors. Therefore, as the control gate 55 becomes thinner, resistance of the word line increases and operation speed of the device decreases. Thus, the upper conductive layer 50 should be planarized by etching to have a sufficient height for the control gate 55 to decrease resistance of the word line and to maintain operational speed of a device. For this, the upper conductive layer 50 must be thick and the mask spacers 30 must be high. Since the height of the mask spacers 30 depend on the height of the sacrificial pattern 88, the sacrificial pattern 88 should be formed thicker than the predetermined height of the mask spacers 30. However, forming an excessively thick silicon nitride is not preferred because the sacrificial pattern 88 is formed at a high temperature. Thus, the thermal budget may cause the diffusion of impurities implanted into the source "s" to occur during the formation of the sacrificial pattern 88.

In addition, as the height of the mask spacers 30 decreases, the upper width $I_1$ of FIG. 2 becomes narrower. This is due to the shape of the mask spacer, which becomes narrower from the bottom to the top thereof. In addition, an interconnection 70 connected to the source plug 45 is also connected to the control gates 55 and causes a short 99. As illustrated in FIG. 4, as the height of the mask spacer 30 increases, the upper width $I_2$ of the etched mask spacer 30 also increases. Thus, short circuiting may be prevented.

Further, using silica and ceria as a slurry, a chemical mechanical polishing process is used as a planarizing etching process for forming the source plug 45. In this case, a plug conductive layer 40 of polysilicon and a sacrificial pattern 88 of silicon nitride are successively etched during the planarizing process, resulting in a non-uniform etch.

SUMMARY OF THE INVENTION

The present invention provides methods of fabricating a non-volatile memory device of split gate type including forming an upper sacrificial pattern, wherein the upper sacrificial pattern is a material having a higher etch selectivity than a lower sacrificial pattern.

According to an embodiment of the present invention, a method of fabricating a non-volatile memory device comprises forming a lower conductive layer on a substrate, and forming a lower and an upper sacrificial pattern, which are sequentially stacked, on the substrate with the lower conductive layer. Next, mask spacers are formed on the sidewalls of the upper and lower sacrificial patterns, wherein the upper and lower sacrificial patterns include a trench exposing a top portion of the lower conductive layer. Using the mask spacers and the upper sacrificial pattern as an etch mask, the exposed conductive layer is etch to form a lower conductive pattern and to expose a portion of the substrate in the trench. A plug conductive layer is then formed to cover an entire surface of a semiconductor substrate with the lower conductive pattern. Next, the plug layer is planarizingly etched to form a source plug. The step of forming the source plug includes planarizingly etching the plug conductive layer until the lower sacrificial pattern is exposed. The formed source plug is connected to the substrate by filling a gap region between the mask spacers.

Preferably, the lower sacrificial pattern is a silicon nitride, and the upper sacrificial pattern and the mask spacers are materials having a higher etch selectivity than the lower sacrificial pattern. Preferably, the upper sacrificial pattern is formed by applying a low temperature chemical vapor deposition process to a silicon oxide layer.

In addition, before forming the lower conductive layer, a device isolation layer is formed in a predetermined region of the substrate to define an active region. Then, a gate oxide layer may be formed to cover the active region. In other words, the lower conductive layer is parallel to the active region and covers the gate oxide layer.

The forming of the upper and lower sacrificial patterns comprise sequentially forming a lower and an upper sacrificial layers on a substrate with the lower conductive layer and successively patterning the upper and lower sacrificial layers to form a trench crossing over the active region. The step of forming the trench includes exposing the active region and using an isotropic etching process to round the exposed top surface.

Preferably, after forming the lower conductive pattern, an impurity region serving as a source is formed in the exposed substrate. In addition, before forming the plug conductive layer, an oxide layer or a nitride layer may be formed to cover sidewalls of the lower conductive pattern.

The step of etching the plug conductive layer to planarize can be performed by a chemical mechanical polishing process. Preferably, using an etch recipe having an etch selectivity with respect to the upper sacrificial pattern. The upper sacrificial pattern may be formed having a thickness of about 200 to about 3000 Å.

After forming the source plug, an etch stop insulation layer is formed on the source plug. Then, the exposed lower sacrificial pattern is removed to expose the lower conductive pattern. Floating gates are then formed under the mask spacers and control gates may be formed beside the floating gates. Preferably, the floating gate is formed by anisotropically etching the exposed lower conductive pattern using the mask spacer as an etch mask. In addition, before forming the control gate, sidewall insulation layers are interposed between the floating gate and the control gate. The sidewall insulation layer is formed by thermally oxidizing the sidewalls of the floating gate.

Then, the step of forming the control gate comprises stacking an upper conductive layer on an entire surface of a substrate with the floating gates, and planarizingly etching the same to form an upper conductive pattern disposed beside the floating gate. The upper conductive pattern is patterned to cross over the active region. Preferably, after forming the control gate, impurity regions are formed in a substrate beside the control gate to be used as a drain region.

DESCRIPTION OF PREFERRED EMBODIMENTS

Figure 1:
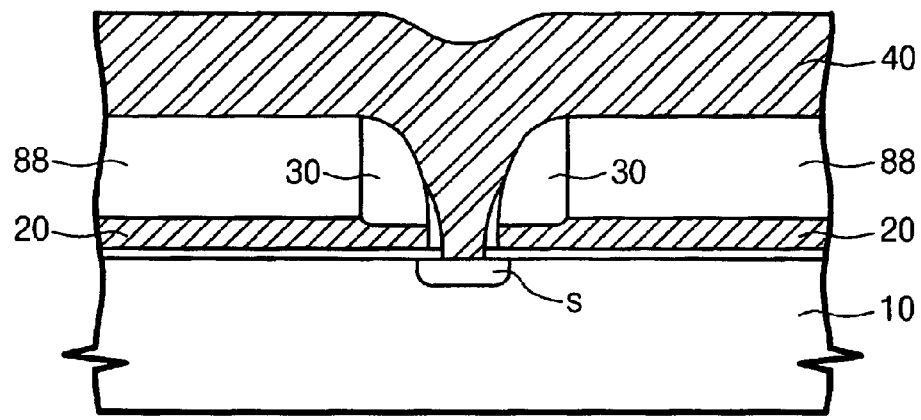
FIGS. 1–4 are cross sectional views for illustrating a conventional method of fabricating a semiconductor device.
Figure 2:
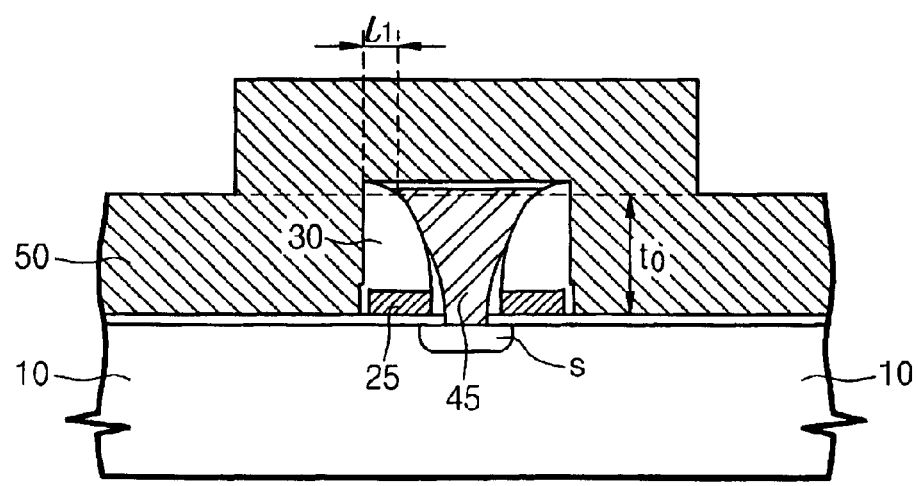
Figure 3:
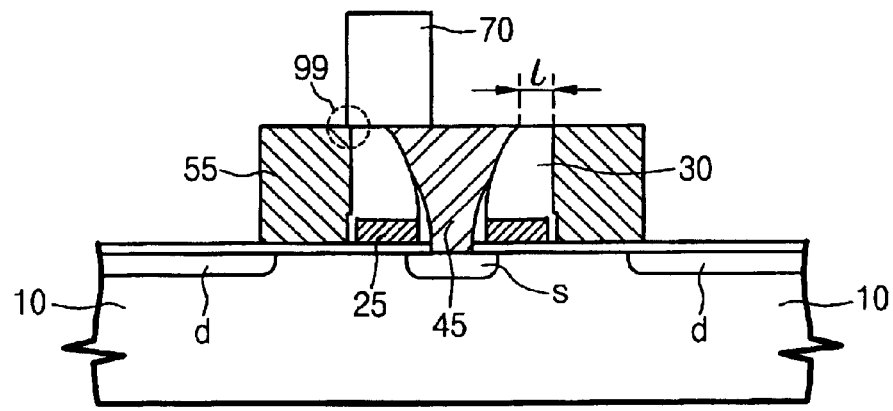
Figure 4:
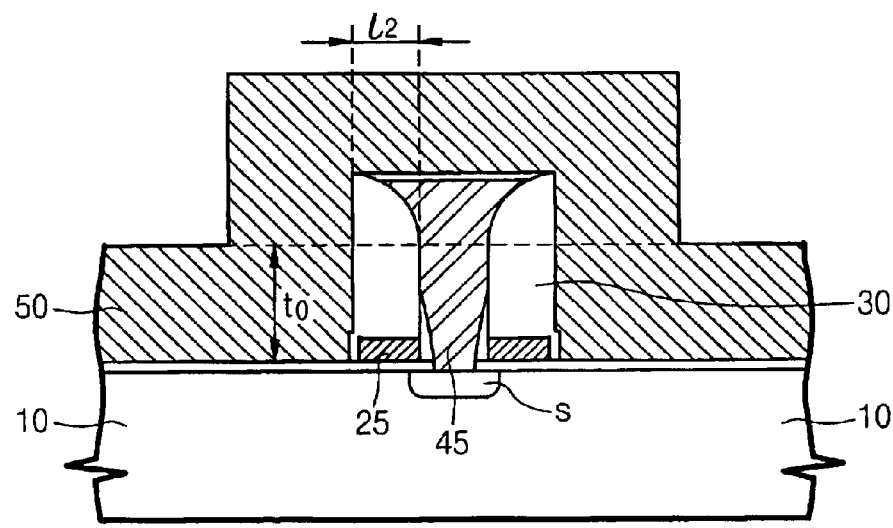

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

FIGS. 5 through 13 are cross-sectional views illustrating a method of fabricating a nonvolatile memory device in accordance with an exemplary embodiment of the present invention.

Figure 5:
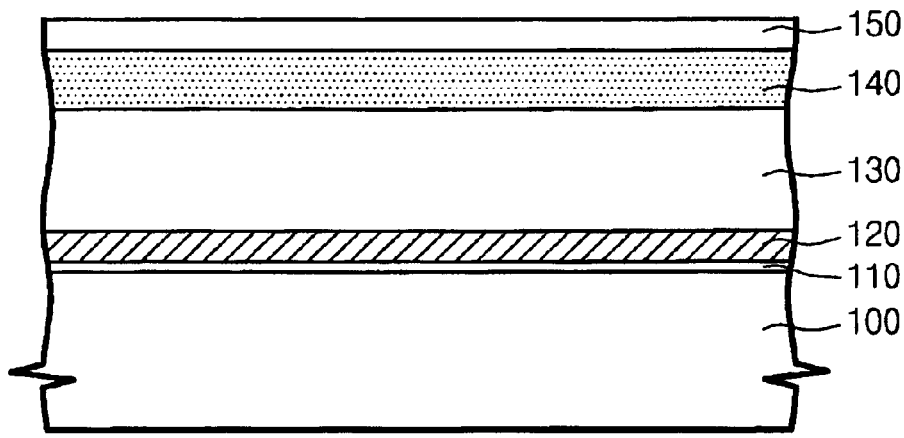
FIGS. 5–13 are cross-sectional views illustrating a method of fabricating a non-volatile memory device in accordance with an exemplary embodiment of the present invention.

Referring to FIG. 5, a device isolation layer (not shown) is formed to define an active region in a substrate 10. A gate oxide layer 110 is formed on the active region. Preferably, the gate oxide layer 110 is a silicon oxide and formed by a thermal oxidation of the active region.

A lower polysilicon layer is formed on an entire surface of a substrate with the gate oxide layer 110, and then patterned to form a lower conductive layer 120 that is parallel to the active region and covers the gate oxide layer 110. A lower sacrificial layer 130 and an upper sacrificial layer 140 are sequentially formed on an entire surface of the substrate with the lower conductive layer 120. Preferably, the lower sacrificial layer 130 is a silicon nitride, and the upper sacrificial layer 140 is a different material from the lower sacrificial layer 130 to selectively etch the upper sacrificial layer 140 with respect to the lower sacrificial layer 130. Preferably, the upper sacrificial layer 140 is a silicon oxide. According to a preferred embodiment of the present invention, the lower sacrificial layer 130 is formed having a thickness of less than about 4000 Å. The upper sacrificial layer 140 plays a role to increase an effective thickness of the lower sacrificial layer 130 without the thermal budget. In addition, the upper sacrificial layer 140 also serves as an etch stop layer having a high etch selectivity to perform a subsequent planarizing etching process. Therefore, according to this embodiment, the upper sacrificial layer 140 is a silicon oxide that is formed having a thickness of about 200 to about 3000 Å by using a chemical vapor deposition process at a temperature of less than about 700° C.

An anti-reflection layer 150 is formed on the upper sacrificial layer 140. In this embodiment, the anti-reflection layer 150 is a silicon oxynitride (SiON) having a thickness of about 800 Å.

Figure 6:
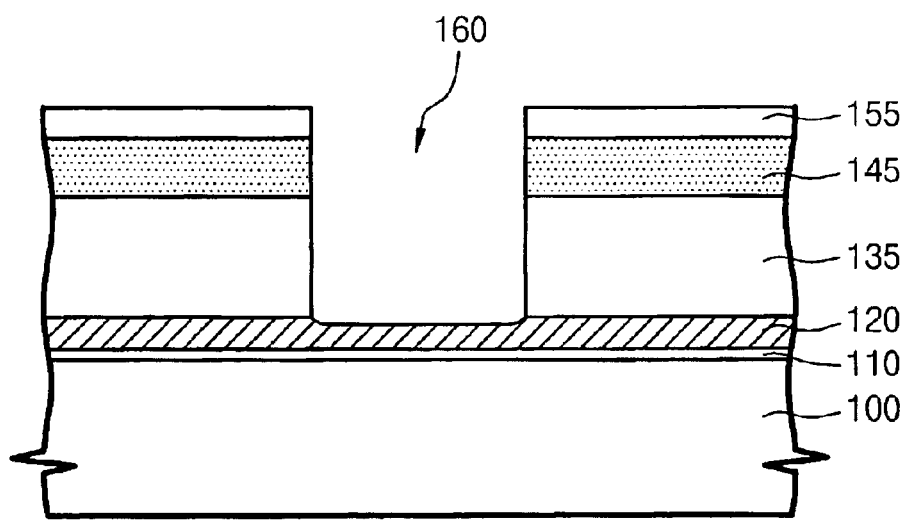

Referring to FIG. 6, a photoresist pattern (not shown) with a trench crossing over the active region is formed on the anti-reflection layer 150. Using the photoresist pattern as an etch mask, the anti-reflection layer 150, the upper sacrificial layer 140 and the lower sacrificial layer 130 are successively etched using an anisotropic etching process. Therefore, a lower sacrificial pattern 135, an upper sacrificial pattern 145 and an anti-reflection pattern 155, which are sequentially stacked, are formed under the photoresist pattern and include a trench 160 exposing a top surface of the lower conductive layer 120.

The steps for forming the trench 160 is preferably carried out to recess the lower conductive layer 120 exposed through the trench 160, wherein the etching process includes an isotropic etching process. Edges of a recessed part (e.g., a region adjoining sidewalls of the lower sacrificial pattern 135) are rounded. The rounded edges of the recessed part are sharp points of floating gates in a subsequent process.

Figure 7:
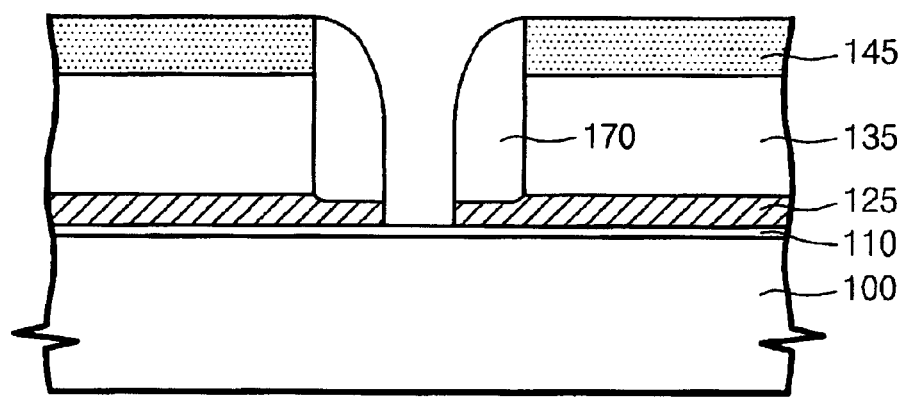

Referring to FIG. 7, the photoresist pattern is removed to expose the anti-reflection pattern 155, and a mask layer is conformally formed on an entire surface of the result structure. The mask layer is formed of a different insulation layer from the lower sacrificial pattern 135 to selectively etch the mask layer with respect to the lower sacrificial pattern 135 and is preferably a silicon oxide. After that, until the lower conductive layer 120 is exposed, the mask layer is etched by an anisotropic etching process to form mask spacers 170 on sidewalls of the trench 160. According to this preferred embodiment, the upper sacrificial pattern 145 is thicker and the mask spacers are formed at a predetermined height to prevent the formation of a short as described above.

Using the mask spacer 170 and the anti-reflection pattern 155 as an etch mask, the exposed lower conductive layer 120 is anisotropically etched. Thus, a lower conductive pattern 125, which is covered with the upper sacrificial pattern 135 and the mask spacer 170, is formed, and the gate oxide layer 110 between the mask spacers 170 is exposed. Further, the anti-reflection pattern 155 used as an etch mask may be removed to expose a top surface of the upper sacrificial pattern 145. An etching process for forming the lower conductive pattern 125 uses an etch recipe having a selectivity with respect to the silicon oxide.

Figure 8:
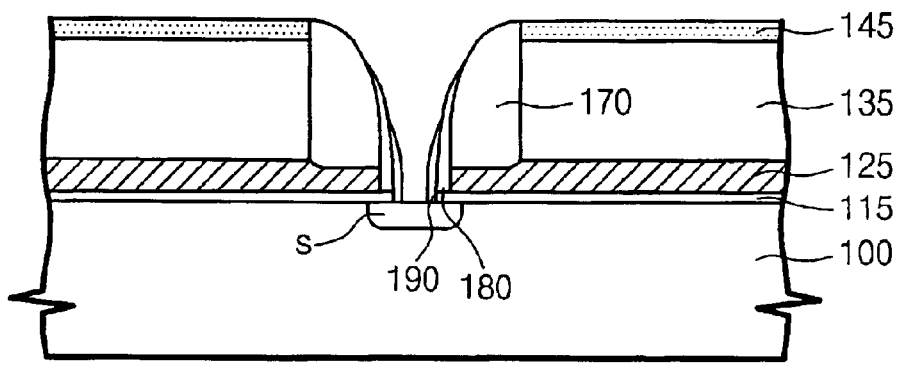

Referring to FIG. 8, the exposed gate oxide layer 110 is etched to form a gate oxide pattern 115 exposing the substrate 100 between the mask spacers 170 without completely removing the upper sacrificial pattern 145. As illustrated in FIG. 5, the upper sacrificial layer 140 is preferably formed to be sufficiently thick.

An ion implantation process is performed using the mask spacers 170 and the upper sacrificial pattern 145 as an etch mask. Thus, an impurity region used as a source "s" is formed in the substrate 100 exposed between the mask spacers 170.

Next, oxide spacers 180 are formed to cover the exposed sidewalls of the lower conductive pattern 125. The oxide spacers 180 are formed by a conventional method. In other words, an oxide layer is formed on a substrate with the gate oxide pattern 115 and then etched by an anisotropic etching process. Preferably, the oxide spacers 180 are made of medium temperature oxide (MTO) formed by a chemical vapor deposition process. In addition, nitride liners 190 may be formed on sidewalls of the oxide spacers 180. The ion implantation for forming the source "s" may be performed before an etching of the gate oxide layer 110 or after a formation of the nitride liner 190.

Figure 9:
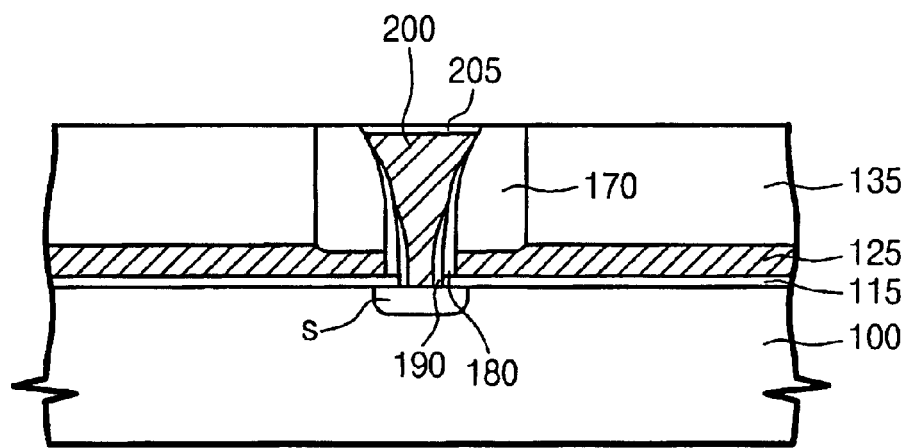

Referring to FIG. 9, a plug conductive layer is formed on an entire surface of the substrate with the nitride liner 190 including filling a gap region between the mask spacers 170. The plug conductive layer is preferably a polysilicon layer formed by a chemical vapor deposition process. Further, a metal layer such as a tungsten layer may be used for the plug conductive layer. If the metal layer is used, a conventional diffusion barrier layer may be further used.

Until the lower sacrificial pattern 135 is exposed, the plug conductive layer is planarizingly etched until the lower sacrificial pattern 135 is exposed to form a source plug 200 connected to the source "s." The planarization etching process for forming the source plug 200 comprises the following two steps. First, the upper plug conductive layer is etched until the upper sacrificial pattern 145 is exposed. Second, the exposed upper sacrificial pattern 145 is etched until the lower sacrificial pattern 135 is exposed. The first and second steps preferably utilize a chemical mechanical polishing process using silica or ceria as a slurry. The upper sacrificial pattern 145 formed of silicon oxide improves etch selectivity of layers during the chemical mechanical polishing process. Hence, the layers are formed with uniformity.

An etch stop insulation layer 205 is formed on the source plug 200. In the exemplary embodiment of the present invention, the etch stop insulation layer 205 is a silicon oxide layer that is formed by thermal oxidation on an exposed top surface of the source plug 200. Thus, top surface of the lower sacrificial pattern 135, the mask spacer 170 and the etch stop insulation layer 205 are exposed. Preferably, the lower sacrificial pattern 135 is a silicon nitride, and the mask spacers 170 and the etch stop insulation layer 205 are a silicon oxide.

Figure 10:
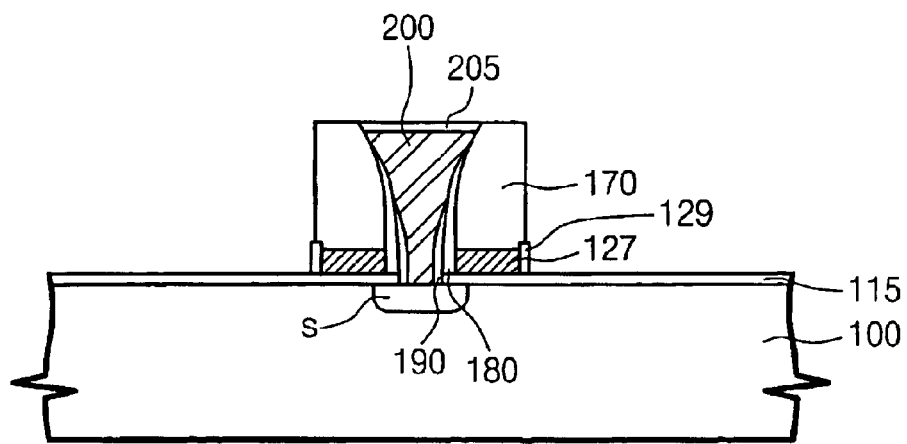

Referring to FIG. 10, the exposed lower sacrificial pattern 135 is removed. Therefore, a top surface of the lower conductive pattern 125 is exposed along the surface of the substrate except at a region under the mask spacers 170. The exposed lower conductive pattern 125 is etched to form a floating gate 127 disposed under the mask spacer 170 and to expose a top portion of the gate oxide pattern 115 on the substrate beside the floating gates 127.

In this exemplary embodiment, the etching process for forming the floating gate 127 uses an etch recipe having a selectivity with respect to the gate oxide pattern 115. In addition, the etching process is performed using anisotropical etching process.

Sidewall insulation layers 129 are formed on the sidewalls of the floating gate 127. A sidewall insulation layer 129 is preferably a silicon oxide layer formed by thermal oxidation on the exposed sidewalls of the floating gate 127. The sidewall insulation layer 129 may be formed of oxide-nitride-oxide. The exposed gate oxide pattern 115 may be removed to expose an active region beside the floating gates 127. Further, a silicon oxide layer may be formed on the exposed active region through a thermal process.

Figure 11:
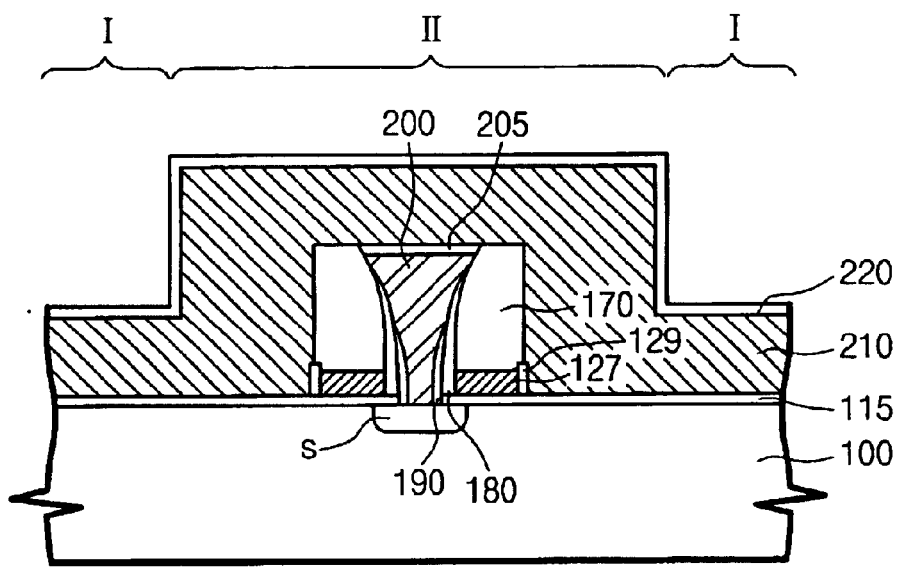

Referring to FIG. 11, an upper conductive layer 210 and an etch stop layer 220, which are sequentially stacked, are conformally formed on an entire surface of a substrate with the sidewall insulation layer 129. In other words, the upper conductive layer 210 and the etch stop layer 220 beside the mask spacers 170 in region I are lower than the upper conductive layer 210 and the etch stop layer 220 formed above the etch stop insulation layer 205 in region II.

Further, as explained above, the thickness of the word line affects the operational speed of a semiconductor device. The thickness of upper conductive layer 210 determines a thickness of the word line in a subsequent process. Therefore, the upper conductive layer 210 should be formed thicker than a predetermined thickness of a word line in a subsequent process. In addition, the upper conductive layer 210 should not be over-etched during a subsequent planarizing etching process. Thus, an etch stop layer 220 is formed on the upper conductive layer 210 to substantially or completely prevent the over-etching of the upper conductive layer.

Figure 12:
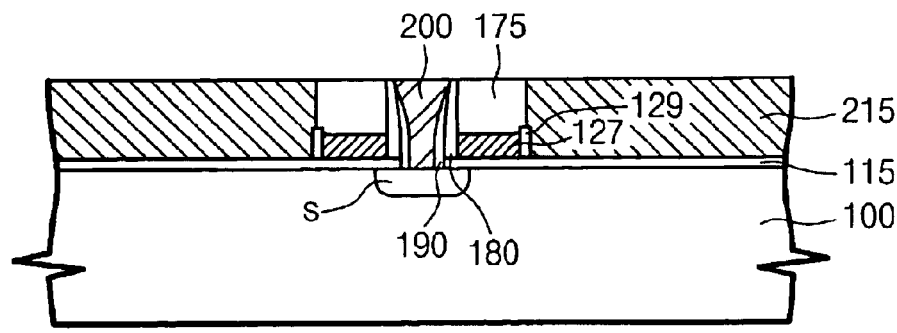

Referring to FIG. 12, the etch stop layer 220 is removed to expose the upper conductive layer 210 at the upper region II. Thus, a residual portion of the etch stop layer 220 covers the upper conductive layer 210 at the lower region I. Next, using an etch recipe having a selectivity with respect to the etch stop layer 220 at the lower region I, the exposed upper conductive layer 210 is planarizingly etched to form the upper conductive pattern 215. Thus, the etched resultant structure is substantially the same or the same height as the residual etch stop layer 220. In addition, the upper conductive pattern 215 is disposed beside the mask spacer 170 and the floating gate 127. Then, the residual etch stop layer 220 is removed.

Preferably, the mask spacers 170 are etched during the planarizing etching process for forming the upper conductive pattern 215. The etched mask spacers 170 form capping patterns 175 covering the floating gates 127. A top portion of the capping patterns 175 are substantially even or even with a top surface of the upper conductive pattern 215. Both sidewalls of the capping patterns 175 are substantially vertical than that of a conventional spacer. In addition, the etch stop insulation layer 205 is removed, and the source plug 200 and the oxide spacer 180 are etched until the etch stop insulation layer 205 and the oxide spacer 180 are substantially even or even with the top surface of the capping pattern 175.

Figure 13:
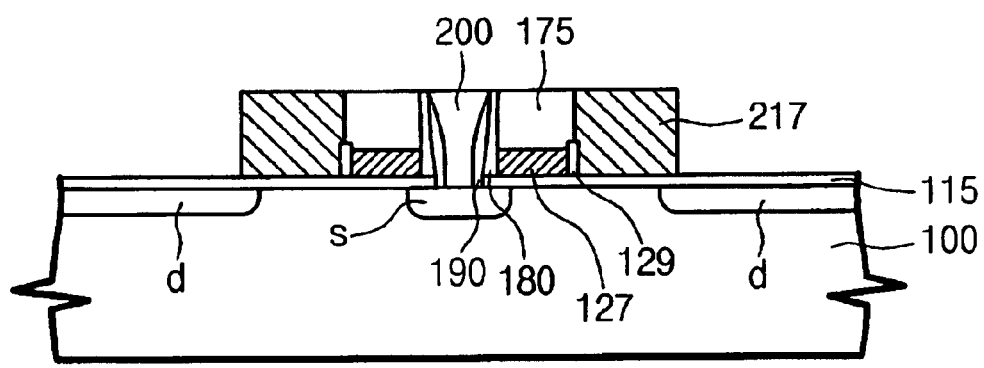

Referring to FIG. 13, the upper conductive pattern 215 is patterned to form control gates 217 disposed beside the floating gates. A thickness of a control gate 217 is the substantially the same or the same as a total thickness of the floating gate 127 and the capping pattern 175.

Impurity regions serving as drain "d" are formed in a substrate 100 beside the control gates 217. Further, additional spacers may be disposed on the side of the control gates 217 to form a drain "d" with LDD structure.

As explained in FIG. 12, both the sidewalls of the capping pattern 175 are substantially vertical so that the control gate 217 and the source plug 200 are efficiently separated from each other. Therefore, contrary to the prior art, a short is prevented from occurring between a word line and a source line.

According to the embodiments of the present invention, an upper sacrificial layer is formed of material such as silicon oxide having a higher etch selectivity than that of the lower sacrificial layer. Therefore, a thermal budget is reduced. In addition, a short between a word line and a source line is prevented by selectively etching the two sacrificial layers. A control gate can be formed so that operational speed of the non-volatile memory device is maintained. In other words, non-volatile memory devices can be formed that have stable and excellent properties such as preventing a short between a word line and a source line and maintaining the operational speed of an electronic device.

While the present invention has been particularly shown and described with reference to preferred embodiments thereof, it will be understood by those of ordinary skill in the art that various changes in form and detail may be made therein without departing from the spirit and scope of the present invention as defined by the following claims.

What is claimed is:

1. A method of fabricating a non-volatile memory device comprising:

forming a lower conductive layer on a substrate;

forming a lower and an upper sacrificial patterns on the substrate, wherein the lower and upper sacrificial patterns include a trench exposing the lower conductive layer, and wherein the upper sacrificial pattern comprises a different material than the lower sacrificial pattern;

forming mask spacers on sidewalls of the upper and lower sacrificial patterns;

etching the exposed lower conductive layer to form a lower conductive pattern exposing the substrate by using the mask spacers and the upper sacrificial pattern as an etch mask;

forming a plug conductive layer covering an entire surface of the substrate with the lower conductive pattern; and planarizing the plug conductive layer until the lower sacrificial pattern is exposed, thereby forming a source plug connected to the exposed substrate in a gap region between the mask spacers.

2. The method of claim 1, before forming the lower conductive layer, further comprising:

forming a device isolation layer in a predetermined region of the substrate; and forming a gate oxide layer covering the active region, wherein the lower conductive layer is parallel to the active region and covers the gate oxide layer.

3. The method of claim 1, wherein said step of forming the upper and lower sacrificial patterns further comprises:

sequentially forming a lower and an upper sacrificial layers on the substrate with the lower conductive layer; and successively patterning the upper and lower sacrificial layers to form a trench that exposes the lower conductive layer and crosses over the active region.

4. The method of claim 3, wherein the forming the trench is performed by anisotropic etching process to round a top portion of the exposed lower conductive layer exposed through the trench.

5. The method of claim 1, wherein the lower sacrificial pattern is a silicon nitride.

6. The method of claim 1, wherein the upper sacrificial pattern and the mask spacers include a different material from the lower sacrificial pattern.

7. The method of claim 1, wherein the upper sacrificial pattern is a silicon oxide.

8. The method of claim 1, further comprises forming an impurity region serving as a source in the exposed substrate, after forming the lower conductive pattern.

9. The method of claim 1, further comprises forming an oxide layer or a nitride layer that covers sidewalls of the lower conductive pattern, before forming the plug conductive layer.

10. The method of claim 1, after forming the source plug, further comprising:

forming floating gates under the mask spacers; and forming control gates beside the floating gates.

11. The method of claim 10, before forming the floating gate, further comprising:

forming an etch stop insulation layer on the source plug; and removing the exposed lower sacrificial pattern to expose the lower conductive pattern.

12. The method of claim 11, wherein said step of forming the floating gate comprises anisotropically etching the exposed lower conductive pattern using the mask spacers as an etch mask.

13. The method of claim 10, before forming the control gate, further comprising:

forming sidewall insulation layers interposed between the floating gates and the control gates.

14. The method of claim 13, wherein the sidewall insulation layers are formed by thermally oxidizing the sidewalls of the floating gates.

15. The method of claim 10, wherein said step of forming the control gates further comprises:
    stacking an upper conductive layer on an entire surface of a substrate with the floating gates;
    planarizing the upper conductive layer to form an upper conductive pattern disposed beside the floating gates; and
    patterning the upper conductive pattern to cross over the active region.

16. The method of claim 10, after forming the control gate, further comprising:
    forming impurity region serving as a drain in a substrate beside the control gates.

17. The method of claim 1, wherein said step of planarizing the plug conductive layer uses a chemical mechanical polishing process.

18. The method of claim 1, wherein said step of planarizing the plug conductive layer uses an etch recipe having a selectivity with respect to the upper sacrificial pattern.

19. The method of claim 1, wherein the upper sacrificial pattern is formed having a thickness of about 200 to about 3000 Å.

20. A method of fabricating a non-volatile memory device comprising:
    forming a conductive layer on a substrate;
    forming a first and a second sacrificial patterns on the substrate, and wherein the first sacrificial pattern comprises a different material than the second sacrificial pattern;
    etching the first and second sacrificial patterns to form a trench and expose a top surface of the conductive layer;
    forming mask spacers on sidewalls of the trench;
    etching the exposed conductive layer to form a lower conductive pattern and expose the substrate by using the mask spacers and the second sacrificial pattern as an etch mask;
    forming a plug conductive layer filling the trench with the mask spacers and connecting to the exposed substrate; and
    planarizing the plug conductive layer until the first sacrificial pattern is exposed to form a source plug connected to the exposed substrate.

* * * * *